United States Patent
Wu et al.

(10) Patent No.: US 7,205,668 B2
(45) Date of Patent: Apr. 17, 2007

(54) MULTI-LAYER PRINTED CIRCUIT BOARD WIRING LAYOUT

(75) Inventors: Ching-Yuan Wu, Sindian (TW); Kuang-Jen Liu, Sindian (TW); Chun-Chi Hsu, Sanchong (TW)

(73) Assignee: Benq Corporation, Taoyuan Shien (TW)

( * ) Notice: Subject to any disclaimer, the term of this patent is extended or adjusted under 35 U.S.C. 154(b) by 0 days.

(21) Appl. No.: 11/285,334

(22) Filed: Nov. 22, 2005

(65) Prior Publication Data

US 2006/0108680 A1 May 25, 2006

(30) Foreign Application Priority Data

Nov. 22, 2004 (TW) ............................... 93135912 A

(51) Int. Cl.
*H01L 23/04* (2006.01)
*H01L 23/02* (2006.01)
*H05K 7/06* (2006.01)

(52) U.S. Cl. ............................. 257/774; 257/E23.021; 257/E23.011; 257/E23.067; 257/690; 257/700; 257/701; 257/758; 257/698; 257/668; 361/48

(58) Field of Classification Search ........ 257/E23.021, 257/E23.011, E23.067, 774, 680, 758, 698, 257/773, 668, 700, 701, 622
See application file for complete search history.

(56) References Cited

U.S. PATENT DOCUMENTS 5,312,765 A * 5/1994 Kanber ........................ 438/59
6,569,604 B1 * 5/2003 Bhatt et al. ................. 430/311
6,706,975 B2 * 3/2004 Sumi et al. .................. 174/264
2002/0028045 A1 * 3/2002 Yoshimura et al. ........... 385/50
2005/0017333 A1 * 1/2005 Bohr ........................... 257/678
2005/0062160 A1 * 3/2005 Naito et al. ................. 257/755
2005/0067675 A1 * 3/2005 Shepard ....................... 257/622
2006/0046475 A1 * 3/2006 Wark et al. .................. 438/667
2006/0068595 A1 * 3/2006 Seliger et al. ............... 438/737

FOREIGN PATENT DOCUMENTS

| JP | 63-306693 | * 12/1988 |
| JP | 2-60188 | * 2/1990 |
| JP | 6-347480 | * 12/1994 |
| JP | 9-92986 | * 4/1997 |

* cited by examiner

*Primary Examiner*—Alexander Oscar Williams
(74) *Attorney, Agent, or Firm*—Thomas, Kayden, Horstemeyer & Risley

(57) ABSTRACT

A multi-layer printed circuit board (PCB) includes a first wire layer, a middle layer above the first wire layer, a second wire layer above the middle layer, and a slanting via formed in the middle layer and the second wire layer. The manufacturing method includes the steps of providing a first wire layer and forming a first wiring on the first wire layer, forming a middle layer on the first wire layer, forming a second wire layer on the middle layer, forming a slanting via in the middle layer and the second wire layer wherein the direction of the slanting via is not orthogonal to the first and the second wire layers, forming a second wiring on the second wire layer by an etching method, and forming an electroplated layer in the via to connect the first wiring and the second wiring.

12 Claims, 4 Drawing Sheets

MULTI-LAYER PRINTED CIRCUIT BOARD WIRING LAYOUT

This application claims the benefit of Taiwan application Serial No. 93135912, filed Nov. 22, 2004, the subject matter of which is incorporated herein by reference.

BACKGROUND OF THE INVENTION

1. Field of the Invention

The invention relates in general to a multi-layer printed circuit board wiring layout and method for manufacturing the same, and more particularly to a multi-layer printed circuit board wiring layout having a slanting via and method for manufacturing the same.

2. Description of the Related Art

The wiring layout on the circuit board of a mobile phone becomes more and more complicated as more and more functions are added. Normally, different wire layers are connected by a via, such as a barrier via, a blind via or a through via, through which signals are transmitted between different wire layers. The following disclosure is exemplified by the via connecting two wire layers.

Referring to FIG. 1A, a structural diagram of a conventional mobile phone printed circuit board having a via is shown. Printed circuit board 100 at least includes a first wire layer 110, a second wire layer 120, a dielectric layer 130 and a via 140 connecting the first wire layer 110 and the second wire layer 120. The first wire layer 110 includes a first wiring 112, and the second wire layer 120 includes a second wiring 122. The via 140 has an electroplated layer (not shown in the diagram) electroplated within to conduct the first wiring 112 and the second wiring 122.

The direction K of the via 140 is perpendicular to the first wire layer 110 and the second wire layer 120, so that the signal S bends at 90° when entering the via 140 from the second wiring 122 at first and then again bends at 90° when entering the first wiring 112 after passing through the via 140. As shown in FIG. 1B, the signal S passes on the second wiring 122 with a wire-width of W1. When the signal S passes through the second wiring 122 the wire-width changes to W2 (W2>W1) at the corner of the via 140 where the second wiring 122 is connected to the electroplated layer 142. The wiring resistance is inversely proportional to the cross-section area of the wiring. Therefore, the cross-section area of the wiring suddenly increases at bending area C and returns to its original size after passing through the bending area C. Consequently, the signal S and adjacent signals as well are easily interfered with by the resistance change of the wiring. Particularly, the higher the frequency of the signal S is, the larger the interference will be, severely affecting the quality of signal transmission between different wire layers.

SUMMARY OF THE INVENTION

It is therefore the object of the invention to provide a multi-layer printed circuit board wiring layout and method for manufacturing the same. By the design of having a slanting via, the printed circuit board prevents resistance change of one wiring from forming a rectangular bending as connected to another wiring vie the via, thus effectively improving the quality of signal transmission between different wire layers.

According to an object of the invention, a multi-layer printed circuit board wiring layout is provided. The multi-layer printed circuit board includes a first wire layer, a middle layer above the first wire layer, a second wire layer above the middle layer, and a slanting via formed in the middle layer and the second wire layer. The second wire layer is positioned above the first wire layer, and the middle layer is positioned between the first wire layer and the second wire layer. The first wire layer includes a first wiring, and the second wire layer includes a second wiring. The slanting via is formed in the second wire layer and middle layer to conduct the first wiring and the second wiring. The direction of the slanting via is not orthogonal to the first wire layer and the second wire layer.

According to another object of the invention, a method for manufacturing a multi-layer printed circuit board is provided. The method includes the steps of providing a first wire layer and forming a first wiring on the first wire layer, forming a middle layer on the first wire layer, forming a second wire layer on the middle layer, forming a slanting via in the middle layer and the second wire layer wherein the direction of the slanting via is not orthogonal to the first and the second wire layers, forming a second wiring on the second wire layer by an etching method, and forming an electroplated layer in the via to connect the first wiring and the second wiring.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIGS. 3A to 3F are diagrams showing the process of manufacturing the multi-layer printed circuit board of FIG. 2A.

DETAILED DESCRIPTION OF THE INVENTION

Figure 1A:
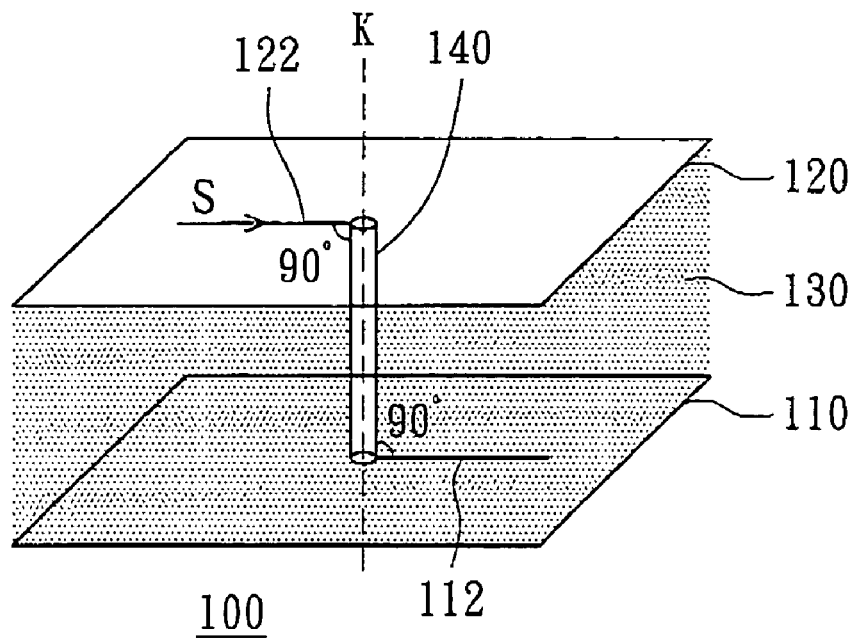
FIG. 1A is a structural diagram of a conventional mobile phone printed circuit board having a via.
Figure 1B:
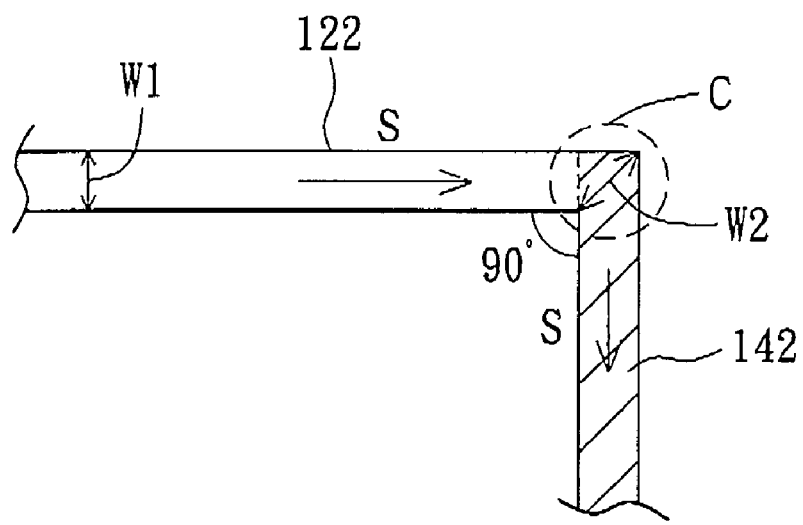
FIG. 1B is a schematic diagram showing the wire-width change of a wiring signal as entering a corner of a via in prior arts.
Figure 2A:
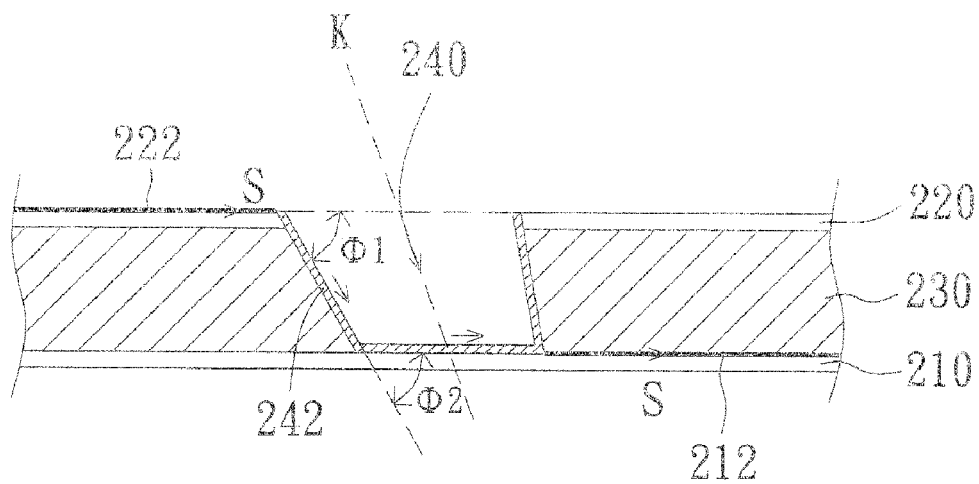
FIG. 2A is a cross-sectional view of a multi-layer printed circuit board wiring layout according to a preferred embodiment of the invention.

Referring to FIG. 2A, a cross-sectional view of a multi-layer printed circuit board wiring layout according to a preferred embodiment of the invention is shown. Multi-layer printed circuit board 200, a mobile phone circuit board for instance, includes a first wire layer 210, a second wire layer 220, a middle layer 230 and a slanting via 240. The second wire layer 220 is positioned above the first wire layer 210, and the middle layer 230 is positioned between the first wire layer 210 and the second wire layer 220. The first wire layer 210 and the second wire layer 220 can be made of copper. The first wire layer 210 includes a first wiring 212, and the second wire layer 220 includes a second wiring 222. The first wiring 212 and the second wiring 222 can be a signal line. The slanting via 240 formed in the second wire layer 220 and the middle layer 230 to conduct the first wiring 212 and the second wiring 222. It is noteworthy that the direction K of the slanting via 240 is not perpendicular to the first wire layer 210 and the second wire layer 220.

Figure 2B:
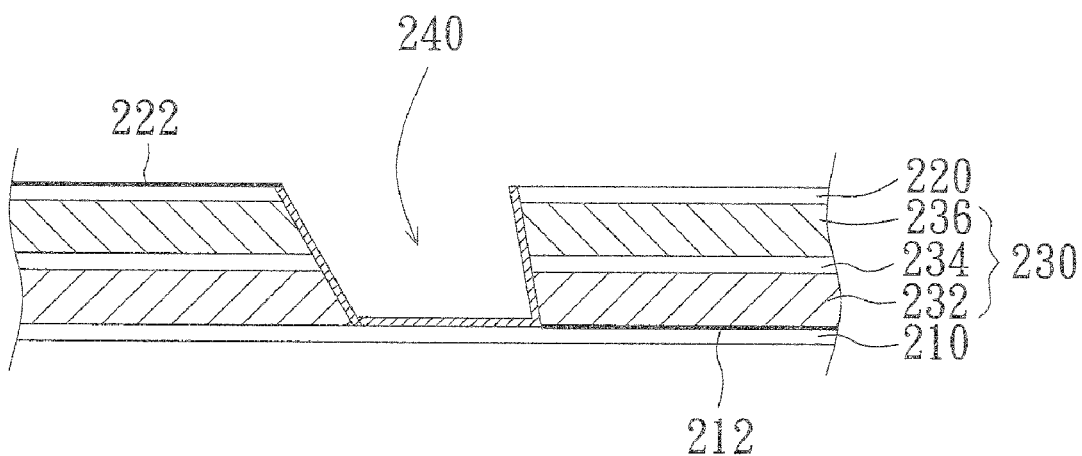
FIG. 2B is a cross-sectional view of an alternative multi-layer printed circuit board wiring layout according to a preferred embodiment of the invention.

As shown in FIG. 2A, the middle layer 230 can be a dielectric layer, and the slanting via 240 can be a barrier via, or blind via. Or as shown in FIG. 2B, the middle layer 230 can include a first dielectric layer 232, a third wire layer 234 and a second dielectric layer 236. The first dielectric layer 232 is positioned between the first wire layer 210 and the third wire layer 234, and the second dielectric layer 236 is positioned between the third wire layer 234 and the second wire layer 220. The slanting via 240 can be a blind via or a through via.

Besides, as shown in FIG. 2A, the slanting via further includes an electroplated layer 242 within for connecting the first wiring 212 and the second wiring 222. Therefore, the signal S of the second wiring 222 enters the slanting via 240 at a bending angle Φ1 smaller than 90°, then the signal S is transmitted to the first wire layer 210 through the electroplated layer 242 and enters the first wiring 212 at a bending angle Φ2 smaller than 90°. Therefore, according to the slanting via 240 design of printed circuit board 200 of the invention, the change in the wire-width of the wiring at the bending when the signal S enters the slanting via 240 or the first wire layer 210 from the second wiring 222 can be effectively reduced, lest resistance change of the wiring at rectangular bending would occur and thus affect the quality of signal transmission.

Figure 3B:
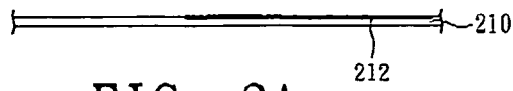
Figure 3B:
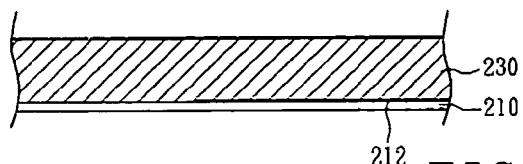
Figure 3B:
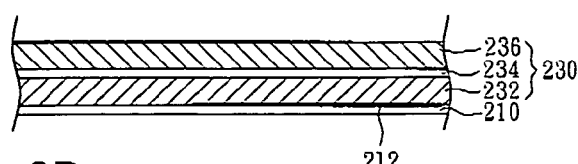
Figure 3C:
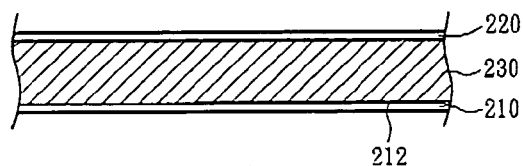
Figure 3C:
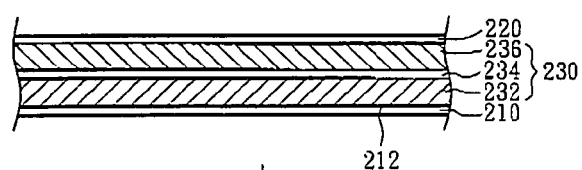

Referring to FIGS. 3A to 3D, a manufacturing process of the multi-layer printed circuit board 200 of FIG. 2A is shown. At first, as shown in FIG. 3A, a first wire layer 210 is provided, and a first wiring 212 is formed on the first wire layer 210. For example, the first wire layer 210 is formed by the deposition of copper, and the first wiring 212 is formed by a lithographic etching method. Next, as shown in FIG. 3B, a middle layer 230 is formed on the first wire layer 210. For example, the middle layer 230 can be a dielectric layer deposited by dielectric materials; or be formed by depositing a first dielectric layer 232 with a first dielectric material, then depositing a third wire layer 234 with copper, and deposing a second dielectric layer 236 with a second dielectric material. Afterwards, a second wire layer 220 is formed on the middle layer 230 as shown in FIG. 3C. For example, the second wire layer 220 is formed by the deposition of copper.

Figure 3D:
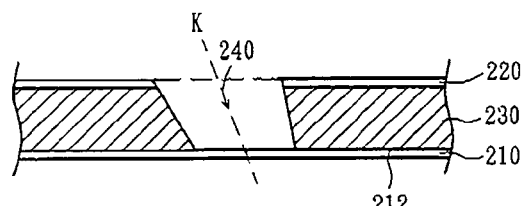
Figure 3D:
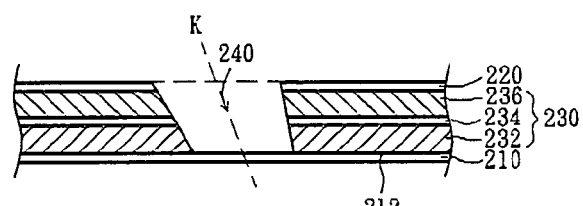
Figure 4A:
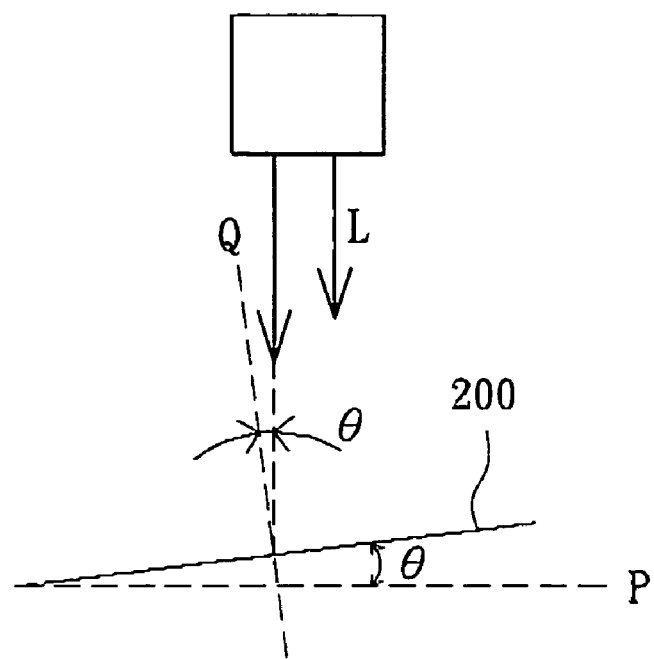
FIGS. 4A and 4B are schematic diagrams showing two methods of forming a slanting via on a printed circuit board by a laser beam according to a preferred embodiment of the invention.

Next, as shown in FIG. 3D, a slanting via 240 is formed in the second wire layer 220 and the middle layer 230. The direction K of the slanting via 240 is not orthogonal to the first wire layer 210 and the second wire layer 220. The slanting via 240 can be formed by a laser etching method, and the laser beam L used for etching tilts at an angle of θ against the normal direction Q of the printed circuit board 200. As shown in FIG. 4A, the printed circuit board 200 to be holed tilts to an angle of θ against the horizontal plane P, and then the laser beam L is projected onto the printed circuit board 200 at an angle perpendicular to the horizontal plane P.

Figure 4B:
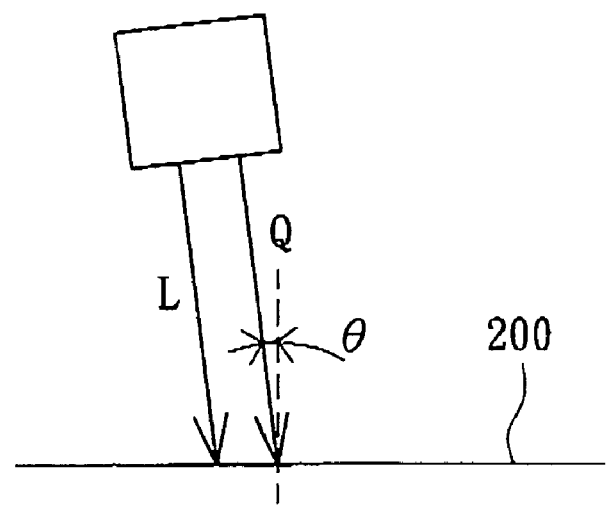

Or as shown in FIG. 4B, the printed circuit board 200 to be holed is placed flat, and the laser beam L is projected onto the printed circuit board 200 at a tilting angle θ from the normal direction Q of the printed circuit board 200. Furthermore, the laser beam L penetrates the second wire layer 220 to the first wire layer 210 and stops at the first wiring 212 of the first wire layer 210, used as a copper pad.

Or, the slanting via 240 can be formed by a mechanical drilling method. As shown in FIG. 4A and FIG. 4B, the drilling bit tilts an angle of θ against the normal direction of the printed circuit board 200, and is not repeated here.

Similarly, the drilling bit penetrates the second wire layer 220 to the first wire layer 210 and stops at the first wiring 212. Furthermore, the slanting via 240 can be a barrier via or blind via as shown in the left diagram of FIG. 3D and can be a blind via or through via as shown in the right diagram of FIG. 3D.

Figure 3E:
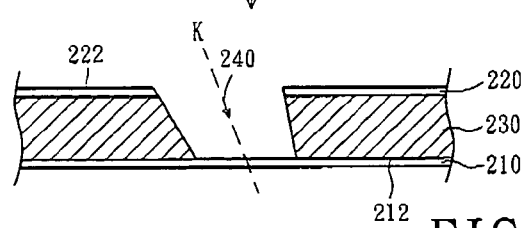
Figure 3E:
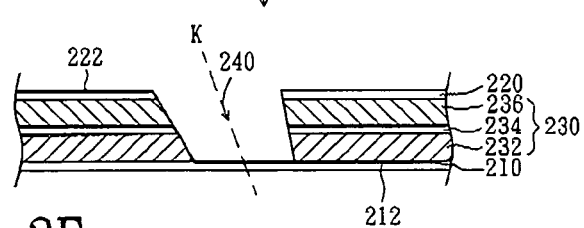
Figure 3F:
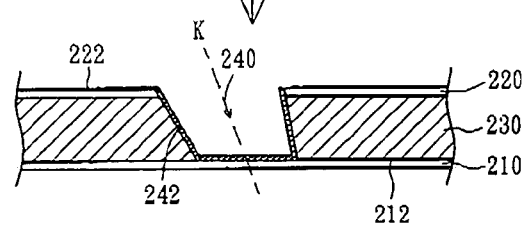
Figure 3F:
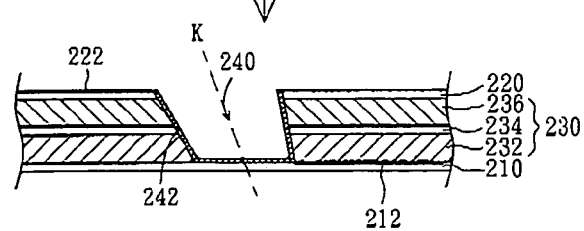

Next, as shown in FIG. 3E, the second wiring 222 is formed on the second wire layer 220 by a lithographic etching method. At last, an electroplated layer 242 is formed in the slanting via 240 to connect the first wiring 212 and the second wiring 222. The manufacturing process of the slanting via of the printed circuit board 200 is completed here as shown in FIG. 3F.

The printed circuit board 200 disclosed above is exemplified by the slanting via 240 connecting two or three wire layers. However, the printed circuit board wiring layout of the invention and the method of manufacturing the slanting via, can be also be applied to the blind via or the through via connecting more than three wire layers. Since the resistance change in the wiring occurring at the bending can be effectively prevented, all these will not be apart from the skill scope of the invention.

The printed circuit board wiring layout and method for manufacturing the same disclosed in above-mentioned embodiment of the invention has the following advantages:

1. The design of having a slanting via prevents resistance change of one wiring at a rectangular bending as connected to another wiring vie a via, thus effectively improving the quality of signal transmission between different wire layers, particularly the high speed and sensitive wire layers.

2. In terms of the first wiring and the second wiring belonging to different wire layers, when the first wiring is disposed below but not directly under the second wiring, the second wiring can be directly connected to the first wiring by the slanting via technology of the invention. Therefore, the via configuration is more convenient than to the conventional technology in which the via has to be vertically connected to the first wire layer from the second wiring, and then connected to the first wiring through other wirings.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A multi-layer printed circuit board wiring layout, comprising:
    a first wire layer comprising a first wiring;
    a middle layer formed on the first wire layer;
    a second wire layer formed on the middle layer, wherein the second wire layer comprises a second wiring; and
    a slanting via formed in the second wire layer and the middle layer to conduct the first wiring and the second wiring, wherein the direction of the slanting via is not orthogonal to the first wire layer and the second wire layer;
    wherein the middle layer comprises a third wire layer, a first dielectric layer positioned between the third wire layer and the first wire layer, and a second dielectric layer positioned between the third wire layer and the second wire layer, and the slanting via is a blind via or a through via.

2. A multi-layer printed circuit board wiring layout, comprising:

a first wire layer comprising a first wiring;
a middle layer formed on the first wire layer;
a second wire layer formed on the middle layer, wherein the second wire layer comprises a second wiring; and
a slanting via formed in the second wire layer and the middle layer to conduct the first wiring and the second wiring, wherein the direction of the slanting via is not orthogonal to the first wire layer and the second wire layer;
wherein the slanting via further comprises an electroplated layer connecting the first wire layer and the second wire layer.

3. The wiring layout according to claim 1, wherein the middle layer is a dielectric layer, and the slanting via is a barrier via or blind via.

4. The wiring layout according to claim 1, wherein the first wiring and the second wiring respectively are a signal line.

5. The wiring layout according to claim 4, wherein one signal of the second wiring enters the slanting via at a bending angle smaller than 90°, and the signal enters the first wire layer at a bending angle smaller than 90° after passing through the slanting via.

6. The wiring layout according to claim 1, wherein the slanting via is formed by a laser etching method.

7. The wiring layout according to claim 1, wherein the slanting via is formed by a mechanical drilling method.

8. The wiring layout according to claim 2, wherein the middle layer is a dielectric layer, and the slanting via is a barrier via or blind via.

9. The wiring layout according to claim 2, wherein the first wiring and the second wiring respectively are a signal line.

10. The wiring layout according to claim 9, wherein one signal of the second wiring enters the slanting via at a bending angle smaller than 90°, and the signal enters the first wire layer at a bending angle smaller than 90° after passing through the slanting via.

11. The wiring layout according to claim 2, wherein the slanting via is formed by a laser etching method.

12. The wiring layout according to claim 2, wherein the slanting via is formed by a mechanical drilling method.

* * * * *